United States Patent [19]

Nishimura

[11] Patent Number: 4,800,282
[45] Date of Patent: Jan. 24, 1989

[54] APPARATUS AND METHOD FOR DETECTING RESIDUAL ORGANIC COMPOUNDS

[75] Inventor: Yasunori Nishimura, Nara, Japan

[73] Assignee: Sharp Kabushiki Kaisha, Osaka, Japan

[21] Appl. No.: 80,222

[22] Filed: Jul. 31, 1987

Related U.S. Application Data

[63] Continuation of Ser. No. 823,624, Jan. 29, 1986.

[30] Foreign Application Priority Data

Feb. 7, 1985 [JP] Japan ................................ 60-23170
Mar. 22, 1985 [JP] Japan ................................ 60-59273

[51] Int. Cl.⁴ .......................................... G01M 11/00
[52] U.S. Cl. ................................ 250/461.1; 250/458.1
[58] Field of Search ................... 250/458.1, 461.1, 302

[56] References Cited

U.S. PATENT DOCUMENTS 4,087,685  5/1978  Froot ............................... 250/461.1
4,608,494  8/1986  Kobayashi et al. .............. 250/461.1

FOREIGN PATENT DOCUMENTS 2565347  12/1985  France ........................... 250/461.1
1182413   2/1970  United Kingdom ........... 250/461.1

OTHER PUBLICATIONS

Dyer et al., "Vidicon Micro. for ... Fluorescent Particles", Rev. of Sci. Instru., vol. 42, No. 4, (1971), p. 508.

Primary Examiner—Janice A. Howell
Assistant Examiner—Richard Hanig
Attorney, Agent, or Firm—Flehr, Hohbach, Test, Albritton & Herbert

[57] ABSTRACT

In order to effectively detect unwanted residual organic compounds such as photoresist pieces left on a semiconductor substrate after a photolithography step during its fabrication process, the substrate surface is irradiated by an ultraviolet light beam and the fluorescent light emitted by the residual organic compounds is detected by a light-receiving element and converted into an electrical signal.

8 Claims, 1 Drawing Sheet

APPARATUS AND METHOD FOR DETECTING RESIDUAL ORGANIC COMPOUNDS

This is a continuation of application Ser. No. 823,624, filed Jan. 29, 1986.

This invention relates to an apparatus and a method for detecting residual organic compounds such as photoresist remaining on a substrate after a photolithography process for the fabrication of a semiconductor device.

Several photolithography processes are generally required in the fabrication of a semiconductor device. In such a photolithography process, a coating of photoresist is generally applied on a cleaned surface of a semiconductor substrate and this layer of photoresist is exposed to a light beam according to a desired pattern. Thereafter, a photoresist layer having the desired pattern is formed by etching and the photoresist layer thus obtained is used as a patterned mask in the subsequent fabrication processes such as etching and ion implantation. The photoresist layer which becomes useless as well as other unwanted organic compounds left on the substrate after the completion of each etching process should be carefully removed from the substrate surface because such residual substances are likely to adversely affect the subsequent processes and the quality of the final product. It therefore goes without saying that it is extremely important to determine whether residual organic compounds such as photoresist pieces are left on the substrate surface. Photoresist, in particular, has a relatively strong adhesive force against the substrate surface because it is intended to play the role of a mask on the semiconductor substrate. Thus, it is not always easy to remove photoresist pieces by washing and those pieces once removed by washing sometimes become attached again at another place on the substrate surface. Conventionally, such residual photoresist pieces were detected visually with the help of an optical microscope. It is difficult, however, to distinguish a photoresist piece from the background surface and residual pieces are easily missed by this method. Moreover, visual inspection methods are generally inefficient and represent a serious obstacle to the automation of the entire fabrication process.

It is therefore an object of this invention in view of the above to provide an apparatus and a method for efficiently detecting residual organic compounds such as photoresist pieces left on a semiconductor substrate.

The above and other objects of the present invention are achieved by causing an ultraviolet light beam to be incident on a substrate surface to be examined in order to detect the fluorescent light emitted by the irradiated residual organic compounds left on the target surface. If the ultraviolet light beam is caused to systematically scan the target substrate surface, the positions of detected residual organic compounds can be displayed on a display means in synchronism with the scanning motion of the ultraviolet light beam.

The accompanying drawings, which are incorporated in and form a part of the specification, illustrate a few embodiments of the present invention and, together with the description, serve to explain the principles of the invention.

Figure 1:
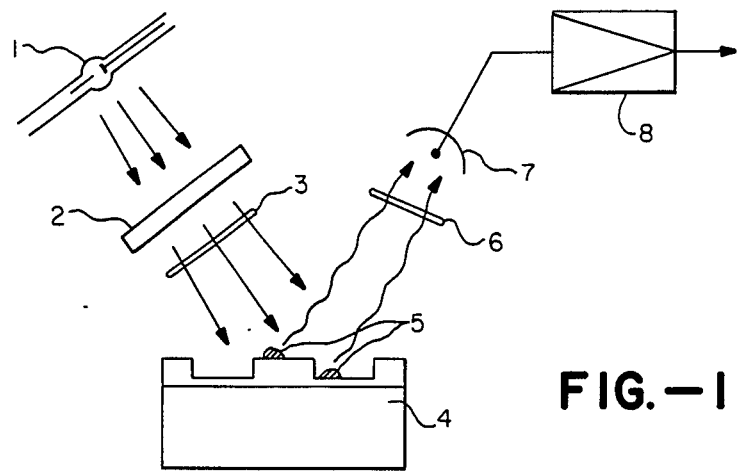
FIG. 1 is a schematic drawing for showing the structure of a detecting apparatus according to one embodiment of the present invention.

Reference being made to FIG. 1, a detecting apparatus according to one embodiment of the present invention comprises a light source 1 such as a mercury lamp which emits an ultraviolet beam of light. The beam emitted from the light source 1 is passed through a filter 2 so as to have its visible components removed. The remaining ultraviolet light beam 3 transmitted through the filter 2 is made incident on a substrate 4 to be inspected.

If there are residual organic compounds 5 such as photoresist pieces attached to the substrate 4, these residues 5 absorb the aforementioned ultraviolet light 3 and emit fluorescent light 6 which is visible. This fluorescent light 6 is detected by a light-receiving element 7 disposed diagonally above the substrate 4.

The fluorescent light 6 received by the light-receiving element 7 is converted into an electrical signal and transmitted to a signal processor 8. The signal processor 8 serves to process the signals from the light-receiving element 7 and to judge whether there are residual organic compounds such as photoresist pieces left on the inspected surface.

Figure 2:
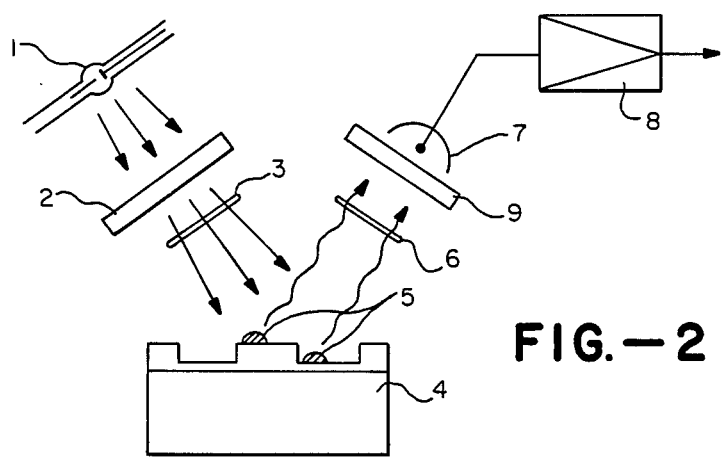
FIG. 2 is a schematic drawing for showing the structure of a detecting apparatus according to another embodiment of the present invention.

Since the wavelength of the emitted fluorescent light varies, depending on the type of the organic compound, an appropriate filter 9 may be placed in front of the light-receiving element 7 as shown in FIG. 2 wherein components corresponding to those in FIG. 1 are indicated by the same numerals as defined above. The filter 9 serves to analyze the fluorescent light spectroscopically so that the types of the residues 5 attached to the substrate 4 can be identified.

Figure 3:
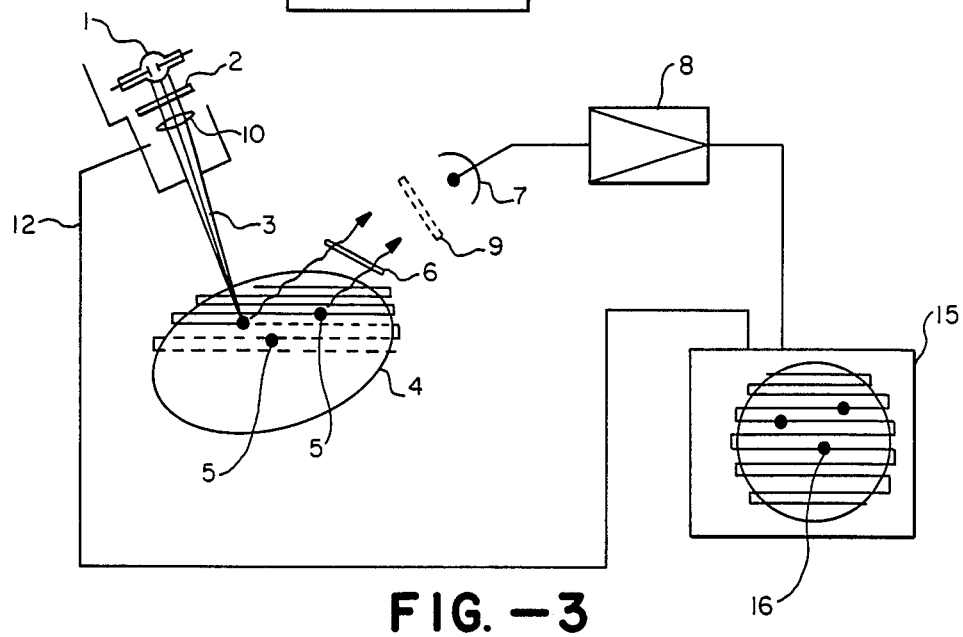
FIG. 3 is a schematic drawing for showing the structure of a detecting apparatus according to a third embodiment of the present invention.

According to still another embodiment of the present invention schematically illustrated in FIG. 3 wherein components corresponding to those in FIGS. 1 and 2 are again indicated by the same numerals as defined above, there is provided in front of the ultraviolet lamp 1 and the optical filter 2 an optical scanning system 10 for scanning a target surface area of the substrate 4 with the ultraviolet light 3 from the lamp 1. The optical system 10 is adapted to output a scanning signal 12 which indicates the position being scanned at the moment on the surface of the substrate 4. When the ultraviolet light 3 from the optical system 10 irradiates a residual photoresist 5 or the like, the fluorescent light 6 emitted thereby is detected by a light-receiving element 7. An optical filter 9 may be utilized in this case as explained in connection with FIG. 2. The light-receiving element 7 is also adapted to generate an electric signal indicative of the light energy incident thereon and output it to the signal processing circuit 8. The signal processing circuit 8 serves to convert the inputted electrical signal into a signal for driving a display means 15 such as a cathode ray tube. Both the signal from the signal processing circuit 8 and a control signal corresponding to the scanning signal 12 from the optical system 10 are inputted to the display means 15 and a position corresponding to the scanning of the ultraviolet light beam 3 is indicated on a display screen. Images 16 of the residual photoresist pieces 5 and the like are displayed as bright spots on the display means 15 in synchronism with the scanning signal 12. This allows the user to detect not only the existence of residual photoresist pieces but also their positions by watching the screen on the display means 15.

Photoresist pieces can be detected generally by the method described above because they usually emit fluorescent light when irradiated by an ultraviolet light beam. Other types of contaminating pieces can also be made detectable by this method described above if the type of radiation emitted by them after the absorption of ultraviolet light is identified and a means for detecting such radiation is provided to the light-receiving element 7.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, although a signal lens was shown in FIG. 3 to symbolically represent the optical scanning system 10, any mechanism conventionally known in the art for regenerating a scanning beam of light may be used. Scanning may alternatively be effected by moving the wafer in a two-dimensional plane with the ultraviolet light beam 3 focused at a fixed point. With respect to the optical filter 9, furthermore, it may be replaced by a spectroscope. Since the wavelength of visible light depends on the type of organic substance which emits it, the substance can be identified to a certain extent by using filters with various cutoff wavelengths. Many changes and modifications which may be apparent to a person skilled in the are intended to be within the scope of this invention.

What is claimed is:

1. An apparatus for detecing residual organic compounds on a surface comprising
    scanning means for forming an ultraviolet light beam for irradiating a target surface and scanning said target surface with said ultraviolet light beam,
    detecting means for detecting fluorescent light from said target surface, and outputting a detection signal in response to said detected fluorescent light,
    judging means for judging the existence of residual organic compounds on said target surface from said detection signal, and
    display means controlled simultaneously by said scanning and judging means for displaying positions of residual organic compounds left on said target surface.

2. The apparatus of claim 1 wherein said irradiating means include an ultraviolet lamp and a filter which serves to absorb visible light emitted from said ultraviolet lamp.

3. The apparatus of claim 1 wherein said detecting means include a light-receiving element which serves to receive fluorescent light and to emit an electrical signal in response thereto.

4. The apparatus of claim 1 wherein said detecting means further includes a second filter for spectroscopic analysis of said fluorescent light.

5. The apparatus of claim 1 wherein said target surface belongs to a semiconductor substrate and said residual organic compounds include photoresist pieces.

6. A method of detecting residual organic compounds on a surface comprising the steps of
    scanning a target surface by an ultraviolet light beam from a scanning apparatus,
    detecting fluorescent light from said target surface,
    judging by a judging apparatus the existence of residual organic compounds on said target surface by analyzing said detected fluorescent light, and
    controlling a display device simultaneously by said scanning apparatus and said judging apparatus to display the positions of residual organic compounds left on said target surface.

7. The method of claim 6 wherein said scanning step includes switching on an ultraviolet lamp and passing a beam therefrom through a filter adapted to absorb visible light in said beam.

8. The method of claim 6 wherein said positions of residual organic compounds are displayed in synchronism with the scanning of said target surface.

* * * * *